(12) United States Patent
Qawami et al.

(10) Patent No.: US 9,195,589 B2
(45) Date of Patent: Nov. 24, 2015

(54) ADAPTIVE CONFIGURATION OF NON-VOLATILE MEMORY

(75) Inventors: Shekoufeh Qawami, El Dorado Hills, CA (US); Rajesh Sundaram, Folsom, CA (US); David J. Zimmerman, El Dorado Hills, CA (US); Blaise Fanning, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 198 days.

(21) Appl. No.: 13/977,084

(22) PCT Filed: Dec. 27, 2011

(86) PCT No.: PCT/US2011/067407
§ 371 (c)(1),
(2), (4) Date: Jun. 28, 2013

(87) PCT Pub. No.: WO2013/100909
PCT Pub. Date: Jul. 4, 2013

(65) Prior Publication Data
US 2013/0339589 A1 Dec. 19, 2013

(51) Int. Cl.
*G06F 3/00* (2006.01)
*G06F 12/02* (2006.01)
*G06F 9/30* (2006.01)
*G06F 1/32* (2006.01)
*G11C 16/06* (2006.01)

(52) U.S. Cl.
CPC .......... *G06F 12/0246* (2013.01); *G06F 1/3275* (2013.01); *G06F 9/30101* (2013.01); *G11C 16/06* (2013.01); *Y02B 60/1228* (2013.01)

(58) Field of Classification Search
None
See application file for complete search history.

(56) References Cited

U.S. PATENT DOCUMENTS

| | | | |
|---|---|---|---|
| 6,449,683 B1* | 9/2002 | Silvester | 711/103 |
| 2004/0095834 A1 | 5/2004 | Chevallier | |
| 2005/0276110 A1 | 12/2005 | Sakurai et al. | |
| 2006/0265617 A1* | 11/2006 | Priborsky | 713/320 |
| 2007/0127279 A1 | 6/2007 | Suyama | |
| 2008/0082763 A1* | 4/2008 | Rajan et al. | 711/154 |
| 2009/0193179 A1 | 7/2009 | Hiroyoshi | |

OTHER PUBLICATIONS

International Search Report and Written Opinion, Mailed Date: Jun. 19, 2012, Application No. PCT/US2011/067407, Filed Date: Dec. 27, 2011, pp. 9.

* cited by examiner

*Primary Examiner* — Idriss N Alrobaye
*Assistant Examiner* — Richard B Franklin
(74) *Attorney, Agent, or Firm* — Kacvinsky Daisak Bluni PLLC

(57) ABSTRACT

Examples are disclosed for adaptive configuration of non-volatile memory. The examples include a mode register configured to include default and updated values to indicate one or more configurations of the non-volatile memory. The examples may also include discoverable capabilities maintained in a configuration table that may indicate memory address lengths and/or operating power states.

25 Claims, 11 Drawing Sheets

Mode Register Format 300

| Clock Field | I/O Field | C/A Field |
|---|---|---|
| 310 | 320 | 330 |

FIG. 3A

Mode Register Value Table 350

| Register Bits | Field | Non-Volatile Memory Configurations |
|---|---|---|
| [1:0] | Clock | 0 -> 200 MHz (default)<br>1 -> 400 MHz<br>2 -> 800 MHz<br>3 -> 0 (RFU) |
| [3:2] | I/O | 0 -> X4 (default)<br>1 -> X8<br>2 -> X16<br>3 -> 0 (RFU) |
| [5:4] | C/A | 0 -> 8 cycles (default)<br>1-> 4 cycles<br>2 -> 0 (RFU)<br>3 -> 0 (RFU) |

FIG. 3B

Memory Addressing Field Format 410

| Array Map | 419 | 417 | 415 | 413 (d-c) | 411 |
|---|---|---|---|---|---|
| Array Decoding | R | Y | X | S | PA |

PA – Partition Address
S – Slice address
X – wordline addresses
Y – bitlines addresses
R – Reserved bit to select the redundant tiles for repairs

FIG. 4A

Addressing Configuration Table 420

| Byte # | Options | Description | | | |
|---|---|---|---|---|---|
| | | X = Bits [1:0] | Y = Bits [3:2] | S = Bits [5:4] | PA = Bits [7:6] |
| Byte 0 | # of X, Y bits, Slice and Partition sizes | 0 -> 11 | 0 -> 9 | 0 -> 16 | 0 -> 16 |
| | | 1 -> 12 | 1 -> 10 | 1 -> 32 | 1 -> 32 |
| | | 2 -> 13 | 2 -> 11 | 2 -> 64 | 2 -> 64 |
| | | 3 -> Rsvd | 3 -> Rsvd | 3 -> Rsvd | 3 -> Rsvd |

FIG. 4B

Power State Configuration Table 500

| Byte # | Options | Description | | | | | | |
|---|---|---|---|---|---|---|---|---|
| Byte 0 | Power States | Off = Bit [0]<br>0 -> disabled<br>1-> enabled | Power Down = Bit[1]<br>0-> disabled<br>1-> enabled | Slow Stdby = Bit [2]<br>0-> disabled<br>1-> enabled | Fast Stdby = Bit [3]<br>0-> disabled<br>1-> enabled | Idle = Bit [4]<br>0-> disabled<br>1-> enabled | Active = Bit [5]<br>0-> disabled<br>1-> enabled | Rsvd = Bit [7:6] |

FIG. 5

Power State Operation Table 800

| Power State | Entry Time | Exit Time | Power Usage | Chip Select | Clock Enable | Description |
|---|---|---|---|---|---|---|
| Active | 0 | 0 | 400-600mW | N/A | | Commands can be issued at any time. |
| Idle | 0 | 0 | 30mW | High | N/A | C/A bus and I/O bus inactive, input buffers disabled. |
| Fast Standby | 0 | 30ns | 1mW | N/A | Toggle to exit | Entered by fast standby command. High power consuming circuits turned on periodically at rate 1. |
| Slow Standby | 0 | 10us | 200-400uW | N/A | Toggle to exit | Entered by slow standby command. High power consuming circuits turned on periodically at rate 2. (rate 1 > rate 2). |
| Powerdown | 5us | 1ms | 100uW | N/A | Low / Toggle to exit | Entered by powerdown command. C/A bus and I/O bus disabled, clocks off. External supply levels maintained but internal charge pumps off. |
| Off | 0 | 2ms | 0 | N/A | | All power supplies ramped down to 0V |

FIG. 8

ADAPTIVE CONFIGURATION OF NON-VOLATILE MEMORY

BACKGROUND

Typically, memory system usage on a computing platform has involved the use of types of memory specifically designed to operate in particular modes. For example, volatile types of memory to include dynamic random access memory (DRAM) may be used to operate in a memory mode that requires fast response times to read/write to these types of memory. Non-volatile types of memory to include hard disk drives, solid state drives or optical disk drives, may be used to operate in a storage mode that requires an ability to store relatively large amounts of data in dense memory arrays.

Volatile memories such as DRAM consume relatively high amounts of power. Mobile computing devices such as smart phones, tablets or ultra-mobile computers may therefore use low power, non-volatile memories. However, different types of non-volatile memories may still be designed to operate in a particular mode (e.g., memory or storage). For example, in some instances, NOR flash memory may be a type of non-volatile memory implemented in a memory mode of operation. Meanwhile, NAND flash memory may be another type of non-volatile memory implemented in a storage mode of operation.

Mobile computing devices are evolving to include increasing computational power. The increasing computational power may benefit from fast response times of DRAM but the cost associated with the power needed may outweigh the benefits. Types of non-volatile memory such as NOR flash memory suffer not only from slower response times compared to DRAM, but also suffer from a limited usable life (e.g., limited read/write cycles). Also, two different types of non-volatile memory implemented in either a memory mode or in a storage mode may use up excessive space on mobile computing devices.

BRIEF DESCRIPTION OF THE DRAWINGS

FIG. 3A illustrates an example mode register format.
FIG. 3B illustrates an example mode register value table.
FIG. 4A illustrates an example memory addressing field format.
FIG. 4B illustrates an example addressing configuration table.
FIG. 5 illustrates an example power state configuration table.
FIG. 8 illustrates an example power state operation table.

DETAILED DESCRIPTION

As contemplated in the present disclosure, response times and usable life associated with flash memory may be problematic to usage on mobile computing devices having increasing computational power. Also, two different types of non-volatile memory may be inflexibly implemented in either a memory mode or in a storage mode and may use up excessive space. Thus a need exists for a flexible, non-volatile memory having the power saving benefits of flash memory but also having improved response times to accommodate increasing computational power on mobile computing platforms. In some examples, a type of non-volatile memory that may address at least some of these needs may be phase change memory (PCM) or PCM with an Ovonic threshold switch (PCMS).

In some examples, a device or a memory system may include non-volatile memory (e.g., PCMS) that may be adaptively configured. For these examples, the non-volatile memory included in the device or system may be configured to operate at one or more frequencies. Also, the device or system may include input/output (I/O) pins and command/address C/A pins for the non-volatile memory. A mode register may also be included in the device or system. The mode register may be configured to include default values to indicate default configurations for the one or more operating frequencies, the I/O pins and the C/A pins. The mode register may also be configured to operate in cooperation with a controller to include updated values based on one or more capabilities of the non-volatile memory discovered (e.g., by the controller) during initialization or power-up of the non-volatile memory. The updated values, for example, may indicate updated configurations for one or more operating frequencies, the input/output pins or the command/address pins.

Figure 1:
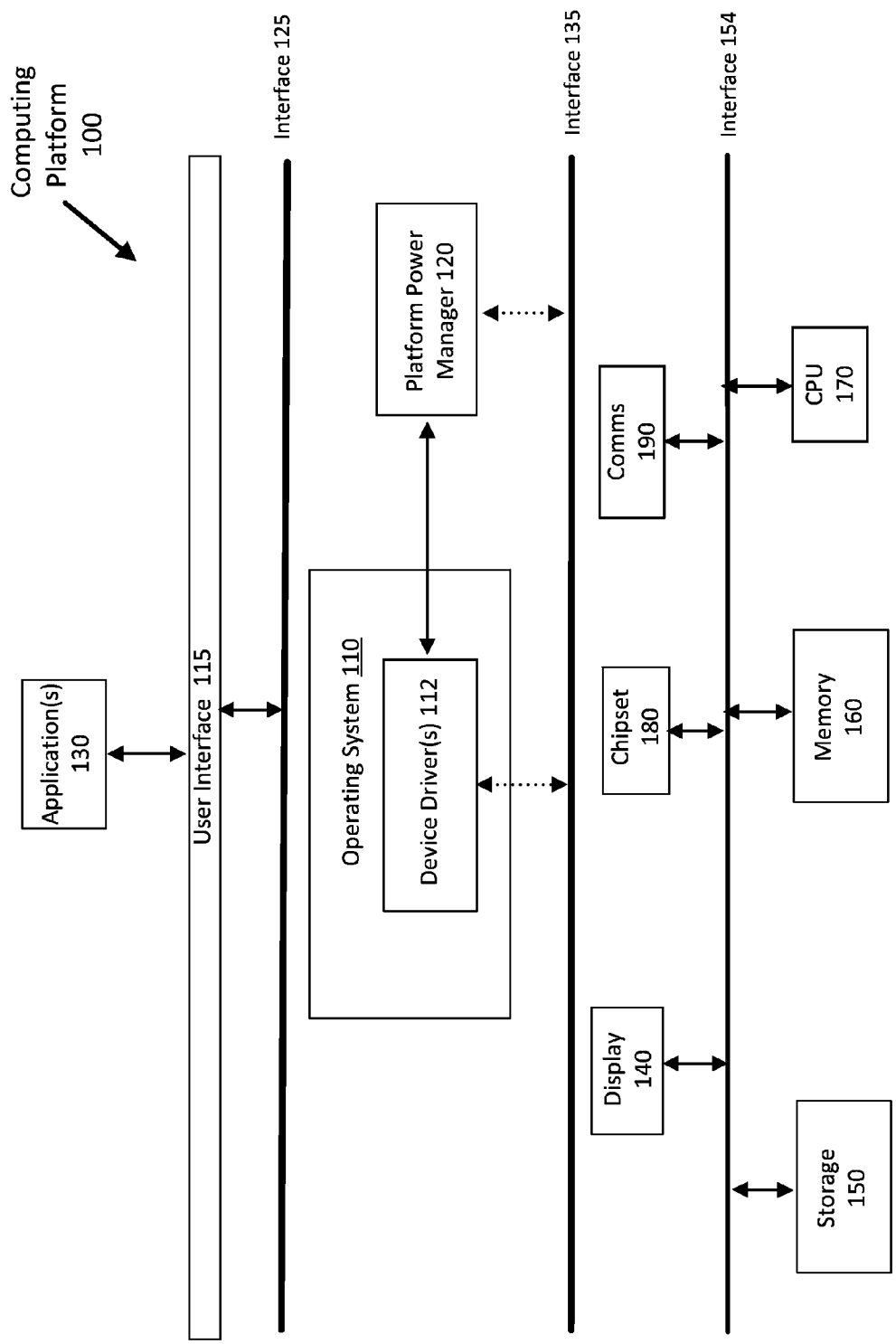
FIG. 1 illustrates an example computing platform.

FIG. 1 illustrates an example computing platform 100. As shown in FIG. 1, computing platform 100 includes an operating system 110, a platform power manager 120, application(s) 130, a display 140, a storage 150, a memory 160, a central processing unit (CPU) 170, a chipset 180, and communications (Comms) 190. According to some examples, several interfaces are also depicted in FIG. 1 for interconnecting and/or communicatively coupling elements of computing platform 100. For example, user interface 115 and interface 125 may allow for users (not shown) and/or application(s) 130 to couple to operating system 110. Also, interface 135 may allow for platform power manager 120 or elements of operating system 110 (e.g., device driver(s) 112) to communicatively couple to elements of computing platform 100 such as display 140, storage 150, memory 160, CPU 170, chipset 180 or comms 190. Interface 154, for example, may allow hardware and/or firmware elements of computing platform 100 to communicatively couple together, e.g., via a system bus or other type of internal communication channel.

In some examples, application(s) 130 may include applications that may be implemented on computing platform 100. For these examples, applications(s) 130 may request certain performance metrics that may facilitate an adaptive or flexible configuration of physical memory (e.g., non-volatile memory) located at storage 150 and/or memory 160.

According to some examples, as shown in FIG. 1, operating system 110 may include device driver(s) 112. Device driver(s) 112 may include logic and/or features configured to interact with hardware/firmware type elements of computing platform 100 (e.g., via interface 135). For example, device driver(s) 112 may include device drivers to control or direct storage 150 or memory 160. Device driver(s) 112 may also interact with platform power manager 120 to adjust power or performance parameters for devices included in computing platform 100. This interaction may include platform power manager 120 sending power saving or high performance indications to elements that may configure or control memory 160 and/or storage 150. The power saving or high performance indications may cause one or more power state transitions for types of memory maintained at memory 160 and/or storage 150.

In some examples, storage 150 may include types of memory configured to be implemented or operated in a storage mode of operation. In a storage mode of operation, storage 150 may include at least one or a combination of different types of storage devices to store relatively large amounts of data. These different types of storage devices may include, but are not limited to, one or more of a magnetic disk drive, an optical disk drive, a tape drive, an internal storage device, an attached storage device, flash memory, battery backed-up SDRAM (synchronous DRAM), a network accessible storage device, and/or PCM or PCMS types of non-volatile memory.

According to some examples, memory 160 may include types of memory configured to be implemented or operated in a memory mode of operation. In a memory mode of operation, memory 160 may be utilized by various elements of computing platform 100 (e.g., as off-chip memory). For these implementations, memory 160 may include at least one or a combination of different types of memory to include random access memory (RAM), dynamic random access memory (DRAM), static RAM (SRAM), phase change material RAM (PRAM), PCM or PCMS types of non-volatile memory.

According to some examples, CPU 170 may be implemented as a central processing unit for computing platform 100. CPU 170 may include one or more processing units or elements having one or more processor cores or having any number of processors having any number of processor cores. CPU 170 may include any type of processing unit, such as, for example, a multi-processing unit, a reduced instruction set computer (RISC), a processor having a pipeline, a complex instruction set computer (CISC), digital signal processor (DSP), and so forth.

In some examples, chipset 180 may provide intercommunication among operating system 110, display 140, storage 150, memory 160, CPU 170 or comms 190. For example, chipset 180 may provide intercommunication between operating system 110, display 140 and CPU 170 to display graphics on display 140 that were rendered by CPU 170 at the request of operating system 110.

In some examples, comms 190 may include logic and/or features to enable computing platform 100 to communicate externally with elements remote to computing platform 100. These logic and/or features may include communicating over wired and/or wireless communication channels or connections via one or more wired or wireless networks. In communicating across such networks, comms 190 may operate in accordance with one or more applicable communication or networking standards in any version.

As mentioned above, interface 154, may allow hardware and/or firmware elements of computing platform 100 to communicatively couple together. According to some examples, communication channels interface 154 may operate in accordance with one or more protocols or standards. These protocols or standards may be described in one or one or more industry standards (including progenies and variants) such as those associated with the Inter-Integrated Circuit (I²C) specification, the System Management Bus (SMBus) specification, the Accelerated Graphics Port (AGP) specification, the Peripheral Component Interconnect Express (PCI Express) specification, the Universal Serial Bus (USB), specification or the Serial Advanced Technology Attachment (SATA) specification. Although this disclosure is not limited to only the above-mentioned standards and associated protocols.

In some examples, computing platform 100 included in a computing device. Examples of a computing device may include a desktop computer, personal computer (PC), laptop computer, ultra-mobile computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Figure 2:
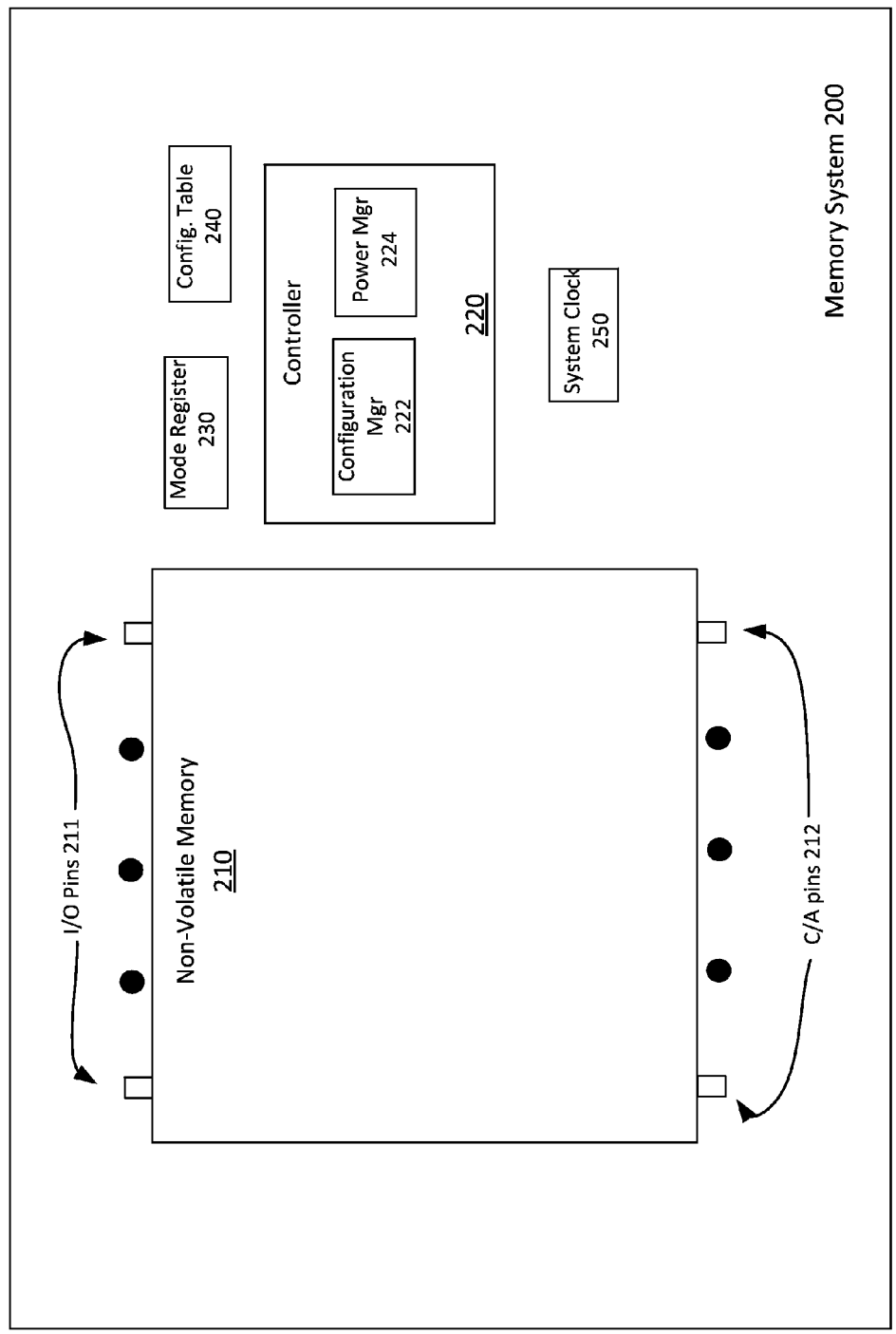
FIG. 2 illustrates a diagram of an example memory system.

FIG. 2 illustrates a diagram of an example memory system 200. In some examples, as shown in FIG. 2, memory system 200 may include non-volatile memory 210, controller 220, mode register 230, configuration table(s) 240 and a clock 250. In some examples, controller 220 may include a configuration manager 222 or a power manager 224. As described more below, configuration manager 222 and/or power manager 224 may include logic and/or features to assist in configuring non-volatile memory 210. In alternative examples, configuration manager 222 and/or power manager 224 may operate separately from controller 220 (e.g., as part of separate control logic) to assist in the configuring of non-volatile memory 210.

According to some examples, controller 220 may include logic and/or features to adaptively configure non-volatile memory 210. Various operating parameters and/or configurations may enable non-volatile memory 210 to operate in either a memory mode or a storage mode. For these examples, non-volatile memory 210 may include input/output (I/O) pins 211 and command/address (C/A) pins 212 that may be flexibly configured to operate in either the memory mode (e.g., as part of memory 160) or the storage mode (e.g., as part of storage 150). Also, clock 250 may be configured to provide various clock operating frequencies to enable non-volatile memory 210 to operate at one or more frequencies. Also, in some examples, mode register 230 and configuration table(s) 240 may include values and/or information to enable controller 220 to adaptively configure non-volatile memory 210.

In some examples, as described more below, mode register 230 may be configured to include default values to indicate default configurations for non-volatile memory 210 during initialization or power up of non-volatile memory 210 and/or system memory 200. For these examples, the default values may indicate an operating frequency (e.g., provided by clock 250), number of active I/O pins from among I/O pins 211 and number of active pins from among C/A pins 212. Mode register 230 may also be configured to operate in cooperation with elements of controller 220 (e.g., configuration manager 222 or power manager 224) to include updated values based on one or more capabilities of non-volatile memory 210 discovered during the initialization or power-up of non-volatile memory 210 and/or system memory 200.

According to some examples, capabilities of non-volatile memory 210 discovered by controller 220 may include available operating frequencies, available I/O pins from among I/O pins 211, available C/A pins from among C/A pins 212. Discoverable capabilities may also be used by the controller to determine what mode of operation (e.g., storage or memory) non-volatile memory 211 may be able to support. For example, combinations of higher operating frequencies, high number of available I/O pins and high number of available C/A pins may indicate fast read/write response times and may be acceptable for use of non-volatile memory 210 in either a memory mode of operation or a storage mode of operation. Also, combinations of lower operating frequencies, low number of available I/O pins and low number of available C/A pins may indicate slower read/write response times and non-volatile memory 210 having these capabilities may operate primarily in a storage mode of operation.

In some examples, controller 220 may also determine to configure non-volatile memory 210 based at least on possible requests provided from elements of computing platform 100 such as application(s) 130 (provided non-volatile memory 210 can support either mode acceptably). For example, application(s) 130 may request a configuration of non-volatile memory 210 that requires a need for relatively large amounts of storage (e.g., an image storing application). For this example, a storage mode of operation may be requested. In other examples, application(s) 130 may request a configuration of non-volatile memory 210 that requires a need for quick read/write times to support graphics intensive applications (e.g., interactive gaming application). For these other examples, a memory mode of operation may be requested.

According to some examples, the updated values associated with the discovered capabilities of non-volatile memory 210 may be included in mode register 230. For these examples, controller 220 may determine to configure non-volatile memory 210 to operate in a given mode of operation based at least on the discovered capabilities of non-volatile memory 210 and/or on requests by elements of computing platform 100. For these examples, elements of controller 220 (e.g., configuration manager 222) may configure non-volatile memory 210 by including the updated values in mode register 230. For example, mode register 230 may include updated values that indicate a selected operating frequency (e.g., 800 megahertz (MHz)) from among the available operating frequencies discovered. Mode register 230 may also include updated values that indicate selected or active I/O pins from among available I/O pins 211 and indicate selected or active C/A pins from among available C/A pins 212.

In some examples, controller 220 may have discovered that non-volatile memory 210 has 16 available I/O pins 211 and 10 available C/A pins 212. For these examples, if controller 220 configures non-volatile memory 210 to operate in a memory mode, all available I/O pins 211 and all available C/A pins 212 may be selected. Also, for these examples, if controller 220 configures non-volatile memory 210 to operate in a storage mode, less than all of the available I/O pins 211 and less than all of the available C/A pins 212 may be selected. Thus for the above examples, a higher number of active I/O pins 211 and C/A pins 212 may be selected for the memory mode operation as compared to the number of active I/O pins 211 and C/A pins 212 for the storage mode of operation.

According to some examples, although not shown in FIG. 2, all or at least portions of mode register 230 may be maintained with non-volatile memory 210. For these examples, during power-up or initialization of non-volatile memory 210, mode register 230 may be accessible by elements of controller 220 (e.g., configuration manager 222) to enable controller 220 to determine default configurations for non-volatile memory 210. Also, updated values may be included in mode register 230 based on one or more capabilities of non-volatile memory 210 discovered during initialization or power-up of non-volatile memory 210.

In some examples, as shown in FIG. 2, memory system 200 also includes configuration table(s) 240. Configuration table(s) 240 may include information to indicate memory addressing and/or power state configuration information. For these examples, configuration table(s) 240 may be configured to provide these indications as discoverable capabilities to controller 220 during initialization or power-up of non-volatile memory 210 and/or memory system 200. For example, as described more below, configuration table(s) 240 may include an addressing configuration table having information to indicate address widths associated with separate memory address fields of a memory addressing field format used to read/write to non-volatile memory 210. Also as described more below, configuration table(s) 240 may also include a power state configuration table having information to operate non-volatile memory 210 at various power states.

As shown in FIG. 2 and mentioned above, controller 220 may include configuration manager 222 and power manager 224. In some examples, as described more below, configuration manager 222 may allow for an adaptive configuration of non-volatile memory 210. Also as described more below, power manager 224 may enable the configuration of non-volatile memory 210 to operate at various power states. Power manager 224 may include logic and/or features configured to transition non-volatile memory 210 between the various power states responsive to, for example, power saving/performance indications from platform power manager 120 of computing platform 100.

In some examples, although not shown in FIG. 2, memory system 200 may include a multitude of non-volatile memories similar to non-volatile memory 210. For these examples, the multitude of non-volatile memories may include separate memory arrays or chips having their own respective I/O pins, C/A pins and operating frequencies. Also, mode register 230 or configuration table 240 may include separate sets of values or information to enable controller 220 to separately or jointly configure the multitude of non-volatile memories. The separate or joint configuration of the multitude of non-volatile memories may be similar to the configuration of non-volatile memory 210 mentioned above. In some examples, controller 220 may configure the non-volatile memories to all operate in a single mode of operation (e.g., storage mode or memory mode) or in a combination of modes of operation.

According to some examples, I/O pins or C/A pins associated with non-volatile memories such as I/O pins 211 and C/A pins 212 may be in various physical configurations on a chip or printed circuit board. For example, the I/O pins or C/A pins may include elements such as wires, soldering pad, solder balls, leads, contacts, traces, etc.

FIG. 3A illustrates an example mode register format 300. As shown in FIG. 3A, mode register format 300 includes clock field 310, input/output (I/O) field 320 and command/address (C/A) field 330. In some examples, a mode register (e.g., mode register 230) using the format of mode register format 300 may be configured to maintain default or updated values associated with configuring a non-volatile memory. For example, clock field 310 may include values to indicate default or updated operating frequencies for the non-volatile memory. I/O field 320 may include values to indicate default or updated I/O pin configurations for the non-volatile memory. C/A field 330 may include values to indicate default or updated C/A pin configurations for the non-volatile memory.

FIG. 3B illustrates an example mode register value table 350. As shown in FIG. 3B, mode register value table 350 includes information to indicate values that may be included in clock field 310, I/O field 320 or C/A field 330 of a mode register in the format of mode register format 300. In some examples, the mode register may be a register configured to store or maintain six bits of information, although this disclosure contemplates mode registers configured to store more or less than six bits of information. For these examples, as shown in FIG. 3B, clock field 310 may include bits [1:0], I/O field 320 may include bits [3:2] and C/A field 330 may include bits [5:4].

According to some examples, as shown in mode register value table 350, binary values included in clock field 310, I/O field 320 or C/A field 330 may indicate default configurations and also possible updated configurations for a non-volatile memory. For example, a binary value of "0" in clock field 310 may indicate a default operating frequency of 200 MHz and a binary value of "1" or "2" in clock field 310 may indicate an updated operating frequency of 400 MHz or 800 MHz, respectively. Also, a binary value of "0" in I/O field 320 may indicate a default I/O pin configuration to support a data path or bus width of "X4" and a binary value of "1" or "2" in I/O field 320 may indicate updated data paths or bus widths of "X8" or "X16", respectively. In some examples, "X4", "X8" or "X16" may represent the number of active I/O pins to support a data bus width of 4, 8 or 16 bits, respectively. Also a binary value of "0" in C/A field 330 may indicate a default C/A pin configuration to support address/command unit intervals (UI) having a length of 8 cycles and binary value of "1" may indicate an updated UI having a length of 4 cycles. In some examples, a length of 8 cycles or 4 cycles may represent the number of active C/A pins to support 5 or 10 command/address lines, respectively. For these examples, more active C/A pins may allow for faster implementation of read/write commands and thus a shorter UI length.

In some examples, as shown in FIG. 3B, some values in clock field 310, I/O field 320 or C/A field 330 may be reserved for future use (RFU). These RFU values, for example, may be reserved to allow for possibly adding an additional operating clock frequency, an additional I/O width or shorter UI cycles. Also, the amount of bits stored or maintained in the mode register may also be increased to allow for more possible values indicated in clock field 310, I/O field 320 or C/A field 330.

FIG. 4A illustrates an example memory addressing field format 410. In some examples, memory addressing field format 410 may be associated with a memory address mapping scheme for a non-volatile memory. As shown in FIG. 4A, memory addressing field format 410 includes fields 411, 413, 415, 417 and 419. In some examples, the fields of addressing format 410 may include various memory addressing fields for the non-volatile memory. For example, field 411 may include a partition address (PA), field 413 may include a slice address, field 415 may include wordline addresses, field 417 may include bitline addresses and field 419 may include reserved information for possible future expansion or changes to memory addressing field format 410.

FIG. 4B illustrates an example addressing configuration table 420. In some examples, addressing configuration table 420 includes information to indicate address lengths associated with separate memory addressing fields of memory addressing field format 410. For these examples, addressing configuration table 420 may be a 1 byte entry maintained along with one or more other configuration tables maintained at or with a memory system. For example, configuration table(s) 240 shown in FIG. 2 for memory system 200.

According to some examples, as shown in FIG. 4B, values to indicate X, Y, slice and partition field lengths may be maintained in bits [1:0], [3:2], [5:4], and [7:6], respectively. For these examples, the binary values included in the above-mentioned bits may provide an indication of separate memory addressing lengths for memory addressing fields associated with the memory address mapping scheme for the non-volatile memory. The memory address mapping scheme, for example, may use memory addressing field format 410. Also, each of the separate memory addressing lengths indicated in addressing configuration table 420 may include at least one reserved value. The at least one reserved value, for example, may allow for future expansion of address lengths for one or more of the addressing fields associated with the memory address mapping scheme that uses or implements memory addressing field format 410.

In some examples, as shown in FIG. 4B, values in bits [1:0] may indicate wordline addresses having lengths of 11, 12 or 13 bits. Values in bits [3:2] may indicate bitline addresses having lengths of 9, 10 or 11 bits. Values in bits [5:4] may indicate a slice address having lengths of 16, 32 or 64 slices. Values in bits [7:6] may indicate a partition address having lengths of 16, 32, or 64 partitions.

According to some examples, addressing configuration table 420 may be configured to provide the indication of address lengths as discoverable capabilities. For example, during power-up or initialization of non-volatile memory 210, controller may obtain values from addressing configuration table 420. The controller 220 may then configure the memory address lengths for fields 411, 413, 415 and 417 of memory addressing field format 410 based on the obtained values. As a result of configuring the memory address lengths, a memory address mapping scheme for non-volatile memory 210 may be established.

FIG. 5 illustrates an example power state configuration table 500. In some examples, power state configuration table 500 includes information to operate a non-volatile memory at various power states. For these examples, power state configuration table 500 may be a 1 byte entry maintained along with one or more other configuration tables (e.g., addressing configuration table 420) maintained at or with a memory system. For example, configuration table(s) 240 shown in FIG. 2 for memory system 200.

According to some examples, as shown in FIG. 5, values to indicate whether various operating power states for the non-volatile memory are enabled or disabled may be included in bits [0] to [5]. Also, bits [7:6] may be reserved for a possible future expansion to add additional power states. For these examples, the various operating power states may include off, power down, slow standby state, fast standby, idle and active. As described more below, the non-volatile memory may transition between these power states based on power saving or high performance indications possibly received from elements of a computing platform (e.g., platform power manager 120).

In some examples, power state configuration table 500 may be configured to provide or present the various power states as discoverable capabilities. For example, during power-up or initialization of non-volatile memory 210, controller 220 may obtain values from power state configuration table 500. Controller 220 may then configure non-volatile memory 210 to operate according to which power states are enabled or disabled.

Figure 6:
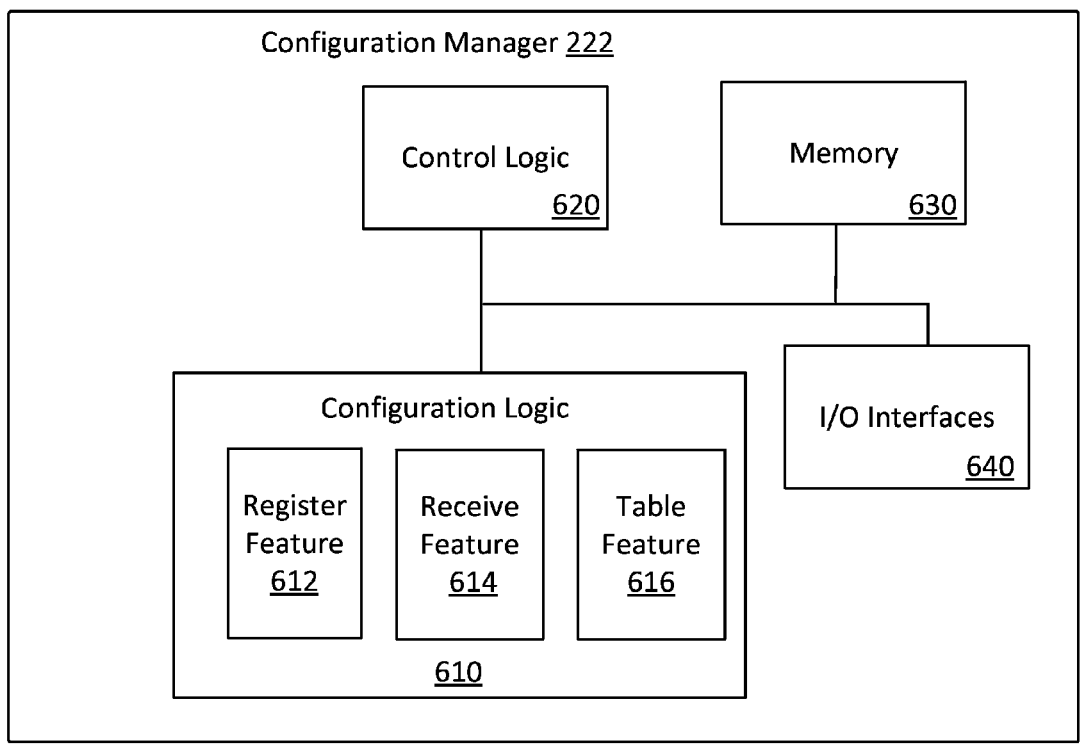
FIG. 6 illustrates a block diagram of an example architecture for a configuration manager.

FIG. 6 illustrates a block diagram of an example architecture for configuration manager 222. In some examples, configuration manager 222 includes features and/or logic configured or arranged to store default values and update values for configuring non-volatile memory in a mode register (e.g., mode register 230). Based on the values stored in the mode register, for example, the non-volatile memory may be configured to operate in a memory mode or a storage mode of operation. Configuration manager 222 may also include features and/or logic configured to store information in configuration tables (e.g., configuration table(s) 240, addressing configuration table 420, power state configuration table 500, etc.) that may be used to establish memory addressing and/or power state schemes as the non-volatile memory is operated.

According to some examples, as shown in FIG. 6, configuration manager 222 includes configuration logic 610, control logic 620, a memory 630 and input/output (I/O) interfaces 640. As illustrated in FIG. 6, configuration logic 610 may be coupled to control logic 620, memory 630 and I/O interfaces 640. Configuration logic 610 may include one or more of a register feature 612, a receive feature 614 or a table feature 616, or any reasonable combination thereof.

In some examples, the elements portrayed in FIG. 6 are configured to support or enable configuration manager 222 as described in this disclosure. A given configuration manager 222 may include some, all or more elements than those depicted in FIG. 6. For example, configuration logic 610 and control logic 620 may separately or collectively represent a wide variety of logic device(s) or executable content to implement the features of configuration manager 222. Example logic devices may include one or more of a microprocessor, a microcontroller, a processor circuit, a field programmable gate array (FPGA), an application specific integrated circuit (ASIC), a sequestered thread or a core of a multi-core/multi-threaded microprocessor or a combination thereof.

In some examples, as shown in FIG. 6, configuration logic 610 includes register feature 612, receive feature 614 or table feature 616. Configuration logic 610 may be configured to use one or more of these features to perform operations. For example, register feature 612 may store default values in a mode register (e.g., mode register 230) for a non-volatile memory. Receive feature 614 may receive updated values based on one or more capabilities of the non-volatile memory discovered during initialization or power-up of the non-volatile memory. Table feature 616 may store information in one or more configuration tables associated with configuring the non-volatile memory.

In some examples, control logic 620 may be configured to control the overall operation of configuration manager 222. As mentioned above, control logic 620 may represent any of a wide variety of logic device(s) or executable content. For some examples, control logic 620 may be configured to operate in conjunction with executable content or instructions to implement the control of configuration manager 222. In some alternate examples, the features and functionality of control logic 620 may be implemented within configuration logic 610.

According to some examples, memory 630 may be arranged to store executable content or instructions for use by control logic 620 and/or configuration logic 610. The executable content or instructions may be used to implement or activate features or elements of configuration manager 222. As described more below, memory 630 may also be arranged to at least temporarily maintain information associated with storing default or update values in a mode register or storing information in one or more configuration tables. Memory 630 may also be arranged to at least temporarily maintain information associated with configuring non-volatile memory to operate in either a memory or storage mode of operation.

Memory 630 may include a wide variety of non-volatile memory media including, but not limited to, one or more of PCM, PCMS, flash memory, programmable variables or states, ROM, or other types of static storage media. In some examples, if implemented in a computing platform without power constraints (e.g., large battery or power cord), memory 630 may include a wider variety of memory media that may also include types of volatile memory, such as DRAM or other types of dynamic storage media.

In some examples, I/O interfaces 640 may provide an interface via a local communication medium or link between configuration manager 222 and elements of memory system 200 depicted in FIG. 2 or elements of computing platform 100 depicted in FIG. 1. I/O interfaces 640 may include interfaces that operate according to various communication protocols to communicate over the local communication medium or link (e.g., I²C, SMBus, AGP, PCI Express, USB, SATA, etc.).

Figure 7:
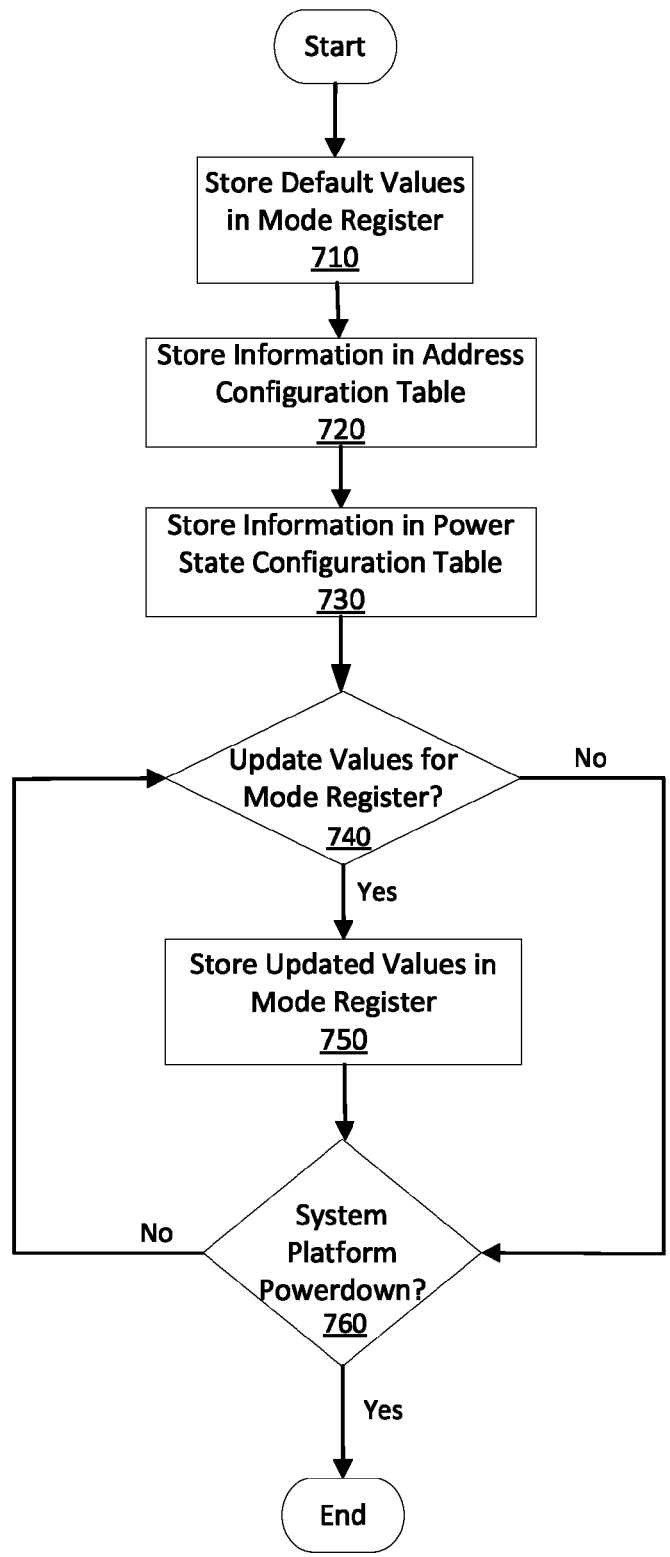
FIG. 7 illustrates a flow chart of example operations to store default and update values in a mode register to configure non-volatile memory.

FIG. 7 illustrates a flow chart of example operations to store default and update values in a mode register to configure non-volatile memory. In some examples, elements of memory system 200 as shown in FIG. 2 may be used to illustrate example operations related to the flow chart depicted in FIG. 7. Configuration manager 222 as shown in FIG. 2 and FIG. 6 may also be used to illustrate the example operations. Mode register format 300, addressing configuration table 420 or power state configuration table 500 shown in FIGS. 3, 4A and 5, respectively, may also be used to illustrate the example operations. But the described example operations are not limited to implementations on memory system 200 or configuration manager 222 or to the format or tables shown in FIG. 3, 4A or 5.

Moving from the start to block 710 (Store Default Values in Mode Register), configuration manager 222 may include logic and/or features configured to store default values to mode register 230 for non-volatile memory 210 (e.g., via register feature 612). In some examples, the default values may indicate default configurations for an operating frequency (e.g., 200 MHz), active I/O pins from among I/O pins 211 (e.g., adequate to support a "4X" data bus width) and active C/A pins from among C/A pins 212 (e.g., adequate to support a UI of 8 cycles). For these examples, the default values may be stored to mode register 230 in the format of mode register format 300. The default configurations indicated may enable non-volatile memory 210 to be configured at power-up or initialization on memory system 200 and/or computing platform 100.

Proceeding from block 710 to block 720 (Store Information in Address Configuration Table), configuration manager 222 may include logic and/or features configured to store information in addressing configuration table 420 (e.g., via table feature 616). In some examples, addressing configuration table 420 may be included with configuration table(s) 240. For these examples, the stored values may indicate address lengths associated with separate memory addressing fields associated with a memory address mapping scheme for non-volatile memory 210. The memory address mapping scheme, for example, may include using memory addressing field format 410. Also, each of the separate memory addressing lengths stored in addressing configuration table 420 may include at least one reserved value (e.g., to allow for future expansion of address lengths). The values stored in addressing configuration table 420 may be arranged or configured to be discoverable capabilities during initialization or power-up of non-volatile memory 210.

Proceeding from block 720 to block 730 (Store Information in Power State Configuration Table), configuration manager 222 may include logic and/or features configured to store information in power state configuration table 500 (e.g., via table feature 616). In some examples, power state configuration table 500 may also be included with configuration table(s) 240. For these examples, the stored values indicate which power states are enabled or disabled. Non-volatile memory 210 may then be operated at one or more power states based on which power states are enabled. The values stored in power state configuration table 500 may be arranged or configured to be discoverable capabilities during initialization or power-up of non-volatile memory 210.

Proceeding from block 730 to decision block 740 (Update Values for Mode Register?), configuration manager 222 may include logic and/or features configured to determine whether updated values for mode register have been received (e.g., via receive feature 614). In some examples, the updated values may be based on one or more capabilities of the non-volatile memory discovered during initialization or power-up of non-volatile memory 210. For these examples, the one or more capabilities may include potential operating frequencies, available I/O pins or available C/A pins for non-volatile memory 210. The one or more capabilities may also include memory addressing lengths, operating power states and modes of operation (e.g., memory mode or storage mode). If updated values have been received, the process moves to block 750. Otherwise the process moves to decision block 760.

Moving from decision block 740 to block 750 (Store Updated Values in Mode Register), configuration manager 222 may include logic and/or features configured to store the received updated values in mode register 230 (e.g., via register feature 612). In some examples, storing the updated values in mode register 230 may enable an operating frequency (e.g., supplied by clock 250), I/O pins from among I/O pins 211 and C/A pins from among C/A pins 212 for non-volatile memory 210 to be configured.

Proceeding from block 750 to decision block 760 (Platform Power Down?), configuration manager 222 may include logic and/or features configured to determine whether memory system 200 and/or computing platform 100 are being powered down (e.g., via receive feature). In some examples, configuration manager 222 may receive an indication of a power down from controller 220 and/or platform power manager 120. If memory system 200 or computing platform 100 has powered down, the process comes to an end. Otherwise, the process moves back to decision block 740.

FIG. 8 illustrates an example power state operation table 800. As shown in FIG. 8, various power states are included in power state operation table 800 to include active, idle, fast standby, slow standby, power down and off power states. According to some examples, the entry/exit times and power usage for the various power states shown in FIG. 8 may be associated with non-volatile memory to include PCMS. Chip select and clock enable signals may be used to transition the PCMS between at least some of the power states. For example, a chip select signal that is driven high may transition the PCMS to an idle power state. Also, toggled clock enable signals may transition the PCMS out of fast standby, slow standby or power down power states. Further, a low clock enable signal transitions the PCMS to a power down power state. Additionally, various commands may be issued to transition the PCMS between at least some of the power states In some examples, non-volatile memory 210 may be configured as a PCMS type of non-volatile memory. For these examples, non-volatile memory 210 may be configured by elements of controller 220 (e.g., power manager 224) to operate at one or more of the various power states included in power state operation table 800. As shown in the description column of power state operation table 800, various buses (e.g., associated with active I/O pins 311 or C/A pins 312), buffers, high power consuming circuits (e.g., internal charge pumps) and clocks (e.g., clock 350) may be enabled or disabled to transition non-volatile memory 210 between the various power states. Although not shown in FIG. 2, the various buses, buffers or high power consuming circuits may be enabled or disabled by power manager 224. Power manager 224 may also be configured to receive and/or issue commands to transition non-volatile memory 210 between at least some of the power states shown in FIG. 8.

According to some examples, non-volatile memory 210 may be configured to operate in the power states included in power state operation table 800. For these examples, as shown in FIG. 8, fast standby has a relatively short exit time of 30 nanoseconds (ns) compared to slow standby's exit time of 10 microseconds (ms). However, non-volatile memory 210 operating in the slow standby power state uses up to $\frac{1}{5}^{th}$ of the power (e.g., 1 milliwatt (mW) vs. 200 microwatts (uW)) when compared to non-volatile memory 210 operating in the fast standby power state.

In some examples, the power usage differential between fast and slow standby power states may be based on the frequency or rate of periodically turning on high power consuming circuits of non-volatile memory 210. For example, in a fast standby power state the high power consuming circuits may be periodically turned on at a first rate. Meanwhile, in a slow standby power state the high power consuming circuits may be periodically turned on at a second rate. For these examples, the first rate may be at a higher frequency than the second rate. Hence, at the higher first rate, high power consuming circuits are turned on more often and more power is consumed by non-volatile memory 210 while operating in the fast standby power state.

In some examples, power state manager 224 may transition non-volatile memory 210 between power states based on power saving or high performance indications. For these examples, power saving or high performance indications may be based on non-volatile memory 210 being implemented on computing platform 100 (e.g., at memory 160 or storage 150) and receiving these indications from platform power manager 120. Application(s) 130, operating system 110 or other elements of computing platform 100 may cause platform power manager 120 to manage power usage on computing platform 100 in either a power savings mode or a performance mode. For these examples, platform power manager 120 may send an indication to power manager 224 to transition non-volatile memory 210 to one or more power states based on either a power saving or high performance mode of operation for computing platform 100.

The power states shown in power state operation table 800 are but one implementation of power state operations for a non-volatile memory. This disclosure contemplates the usage of other entry/exit/power usage values not depicted in power state operation table 800.

According to some examples, computing platform 100 may be configured to operate in compliance with all progeny and variants of an industry standard such as the Advanced Configuration Power Interface (ACPI) specification, revision 5.0, published December 2011. Elements of computing platform 100 may be transitioned between various ACPI power states to include processor performance states for CPU 170. For these examples, the relatively fast exit and entry times for the PCMS type of non-volatile memory to transition between an active power state, idle state or to a fast/slow standby state may enable this type of non-volatile memory to match at least some of the ACPI processor performance states implemented by CPU 170. Platform power manager 120 and/or operating system 110 may relay either power saving or high performance indications to power manager 224 based on the ACPI performance states for one or more processors included in CPU 170.

Figure 9:
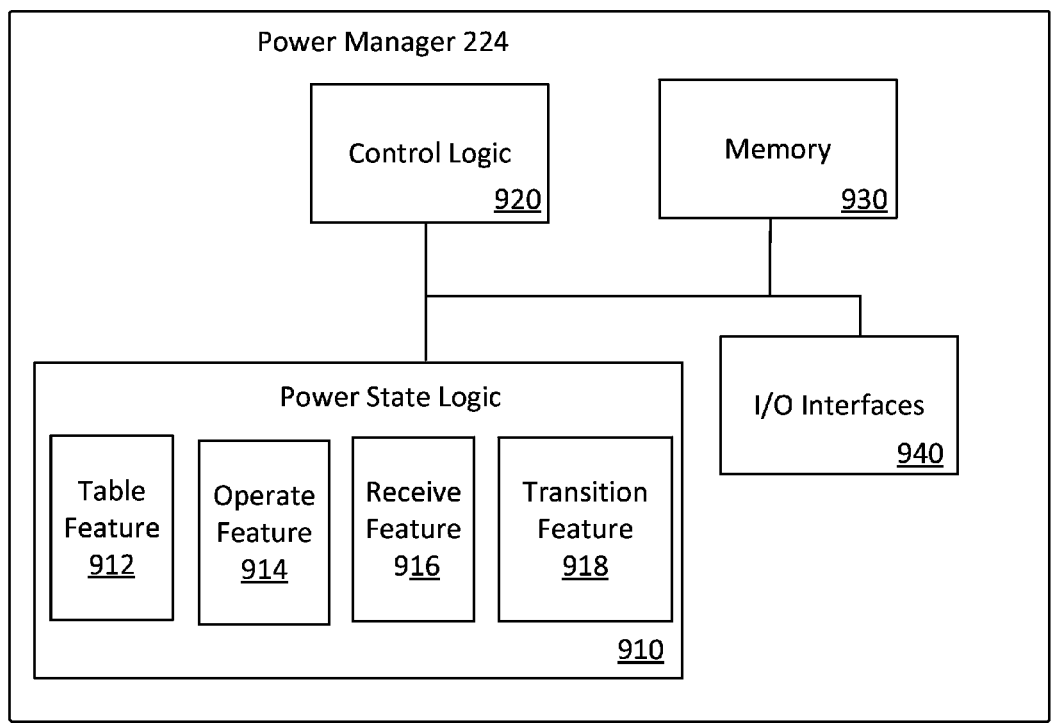
FIG. 9 illustrates a block diagram of an example architecture for a power manager.

FIG. 9 illustrates a block diagram of an example architecture for power manager 242. In some examples, power manager 224 includes features and/or logic configured or arranged to receive power state information to configure a non-volatile memory (e.g., non-volatile memory 210) to operate at various power states on a computing platform (e.g., computing platform 100). For these examples, power manager 224 may include logic and/or features configured to transition the non-volatile memory between power states. Transitions may occur, for example, responsive to power saving or high performance indications from a platform manager (e.g., platform manager 120) for a computing platform.

According to some examples, as shown in FIG. 9, power manager 224 includes power state logic 910, control logic 920, a memory 930 and input/output (I/O) interfaces 940. As illustrated in FIG. 9, power state logic 910 may be coupled to control logic 920, memory 930 and I/O interfaces 940. Power state logic 910 may include one or more of a table feature 912, an operate feature 914, a receive feature 916 or a transition feature 918, or any reasonable combination thereof.

In some examples, the elements portrayed in FIG. 9 are configured to support or enable power manager 224 as described in this disclosure. A given power manager 224 may include some, all or more elements than those depicted in FIG. 9. For example, power state logic 910 and control logic 920 may separately or collectively represent a wide variety of logic device(s) or executable content to implement the features of power manager 224. Example logic devices may include one or more of a microprocessor, a microcontroller, a processor circuit, a field programmable gate array (FPGA), an application specific integrated circuit (ASIC), a sequestered thread or a core of a multi-core/multi-threaded microprocessor or a combination thereof.

In some examples, as shown in FIG. 9, power state logic 910 includes table feature 912, operate feature 914, receive feature 916 or transition feature 918. Power state logic 910 may be configured to use one or more of these features to perform operations. For example, table feature 912 may receive or obtain power state information to configure a non-volatile memory to operate in various power states. Operate feature 914 may operate or facilitate the operation of the non-volatile memory in the various power states. Receive feature 916 may receive power saving or high performance indications from a platform power manager and transition feature 918 may then transition the non-volatile memory between lower power and higher power states based on the received indications.

In some examples, power state logic 920 may be configured to control the overall operation of power manager 224. As mentioned above, power state logic 920 may represent any of a wide variety of logic device(s) or executable content. For some examples, control logic 920 may be configured to operate in conjunction with executable content or instructions to implement the control of power manager 224. In some alternate examples, the features and functionality of control logic 920 may be implemented within power state logic 910.

According to some examples, memory 930 may be arranged to store executable content or instructions for use by control logic 920 and/or power state logic 910. The executable content or instructions may be used to implement or activate features or elements of power manager 224. As described more below, memory 930 may also be arranged to at least temporarily maintain power state information to configure a non-volatile memory to operate at various power states on a computing platform and to also transition the non-volatile memory between the various power states.

Memory 930 may include a wide variety of non-volatile memory media including, but not limited to, one or more of PCM, PCMS, flash memory, programmable variables or states, ROM, or other types of static storage media. In some examples, if implemented in a computing platform without power constraints (e.g., large battery or power cord), memory 930 may include a wider variety of memory media that may also include types of volatile memory, such as DRAM or other types of dynamic storage media.

In some examples, I/O interfaces 940 may provide an interface via a local communication medium or link between power manager 224 and elements of memory system 200 depicted in FIG. 2 or elements of computing platform 100 depicted in FIG. 1. I/O interfaces 940 may include interfaces that operate according to various communication protocols to communicate over the local communication medium or link (e.g., I²C, SMBus, AGP, PCI Express, USB, SATA, etc.).

Figure 10:
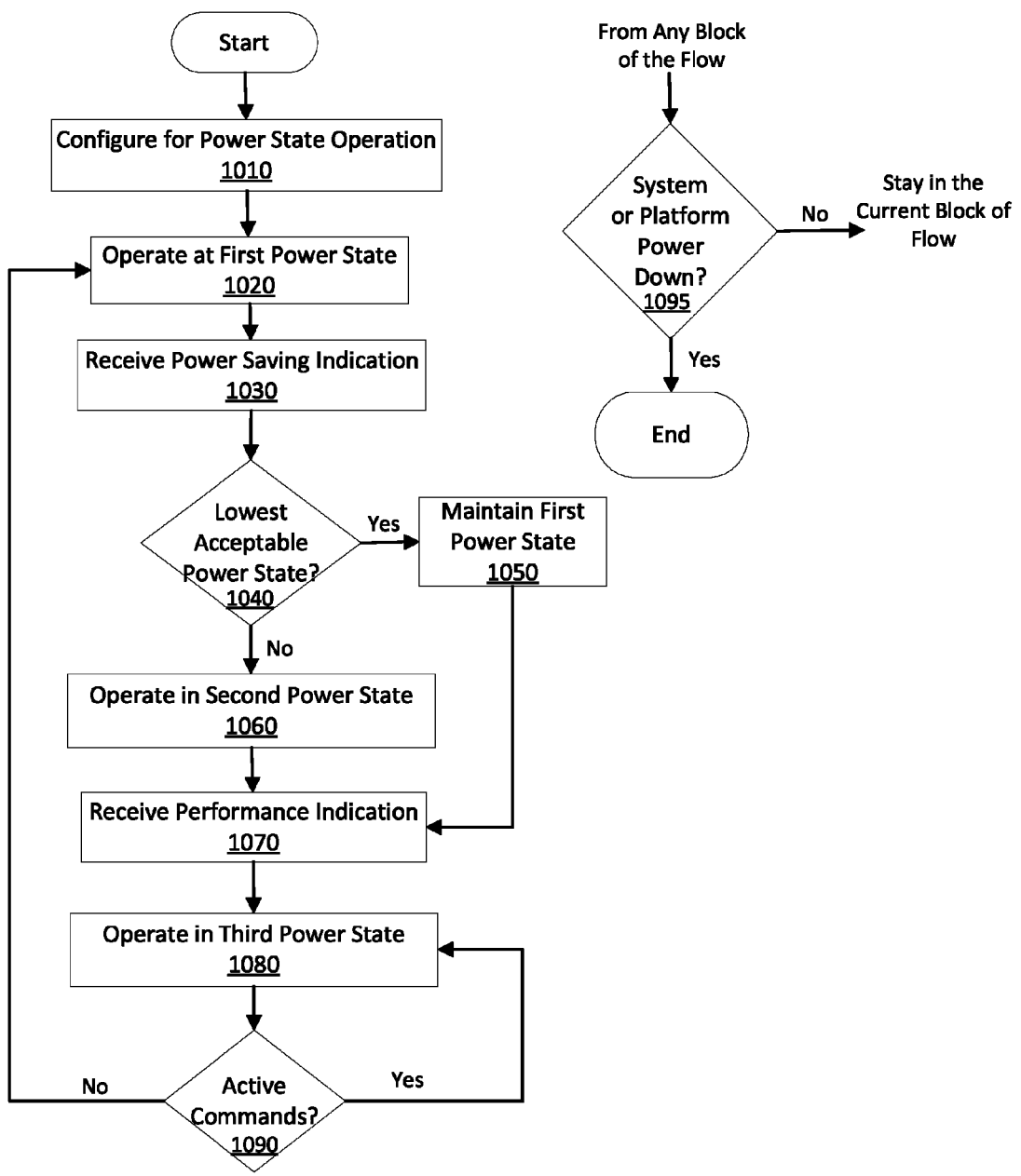
FIG. 10 illustrates a flow chart of example operations for configuring non-volatile memory to operate at various power states on a computing platform.

FIG. 10 illustrates a flow chart of example operations for configuring non-volatile memory to operate at various power states on a computing platform. In some examples, elements of memory system 200 as shown in FIG. 2 may be used to illustrate example operations related to the flow chart depicted in FIG. 10. Power manager 224 as shown in FIG. 2 and FIG. 9 may also be used to illustrate the example operations. Power state configuration table 500 shown in FIG. 5 or power state operation table 800 in FIG. 8 may also be used to illustrate the example operations. But the described example operations are not limited to implementations on memory system 200 or power manager 224 or to the tables shown in FIG. 5 or 8.

Moving from the start to block 1010 (Configure for Power State Operation), power manager 224 may include logic and/or features configured to receive power state information to configure non-volatile memory 210 to operate at various power states (e.g., via table feature 912). In some examples, the power state information may be received from power state configuration table 500 and/or power state information table 800.

Proceeding from block 1010 to block 1020 (Operate at First Power State), power manager 224 or controller 120 may include logic and/or features configured to operate non-volatile memory 210 in a first power state (e.g., operate feature 914). In some examples, the first power state may be an idle power state. For these examples, in an idle power state, no active read/write commands are being serviced or executed using non-volatile memory 210 and as indicated in power state operation table 800, C/A and I/O buses are inactive. Also, according to power state operation table 800, input buffers for non-volatile memory 210 may be disabled.

Proceeding from block 1020 to block 1030 (Receive Power Saving Indication), power manager 224 may include logic and/or features configured to receive a power saving indication from platform power manager 120 (e.g., via receive feature 916). In some examples, computing platform 100 may be operated in compliance with the ACPI specification and power manager 120 may send the power saving indication based at least on one or more processor elements (e.g., from CPU 170) of computing platform 100 entering lower power performance states to conserve power.

Proceeding from block 1030 to decision block 1040 (Lowest Acceptable Power State?), power manager 224 may include logic and/or features configured to determine whether non-volatile memory 210 is already at the lowest acceptable power state (e.g., via transition feature 218). In some examples, entry and exit times for the various power states as indicated in power state operation table 800 may dictate if the non-volatile memory is already in the lowest acceptable power state. For example, the exit times of fast or slow standby power states may be too slow to operate in cooperation with the one or more processor elements of computing platform 100. Thus, the idle power state may be the lowest acceptable power state for this example. If non-volatile memory 210 is in the lowest acceptable power state, the process moves to block 1050. Otherwise, the process moves to block 1060.

Moving from decision block 1040 to block 1050 (Maintain First Power State), power manager 224 may maintain the first (idle) power state.

Moving from block 1050 to block 1060 (Operate in Second Power State), power manager 224 may include logic and/or features configured to transition volatile memory 210 to operate in a second power state (e.g., via transition feature 218). In some examples, the second power state may be either the fast standby power state or the slow standby power state.

Moving from either block 1050 or block 1060 to block 1070 (Receive Performance Indication), power manager 224 may include logic and/or features configured to receive a high power indication from platform power manager 120 (e.g., via receive feature 916). In some examples, power manager 120 may send the power saving indication based at least on one or more processor elements of computing platform 100 or possibly other elements of computing platform 100 entering higher power performance states.

Proceeding from block 1070 to block 1080 (Operate in Third Power State), power manager 224 may include logic and/or features to transition non-volatile memory 210 to the third power state (e.g., via transition feature 918). In some examples, the third power state may be the active power state. For these examples, the active power state is the highest power usage state indicated in power state operation table 800.

Proceeding from block 1080 to decision block 1090 (Active Commands?), power manager 224 may include logic and/or features configured to determine if active read/write commands are currently being serviced or executed using non-volatile memory 210. If active read/write commands are being serviced the process moves to block 1020. Otherwise the process moves to block 1080.

Moving from any block of the flow to decision block 1095 (Platform Power Down?), power manager 224 may include logic and/or features to determine whether memory system 200 and/or computing platform 100 is being powered down (e.g., via operate feature 914). If memory system 200 and/or computing platform 100 are being powered down the process comes to an end. Otherwise, the process stays in the current block of flow.

Figure 11:
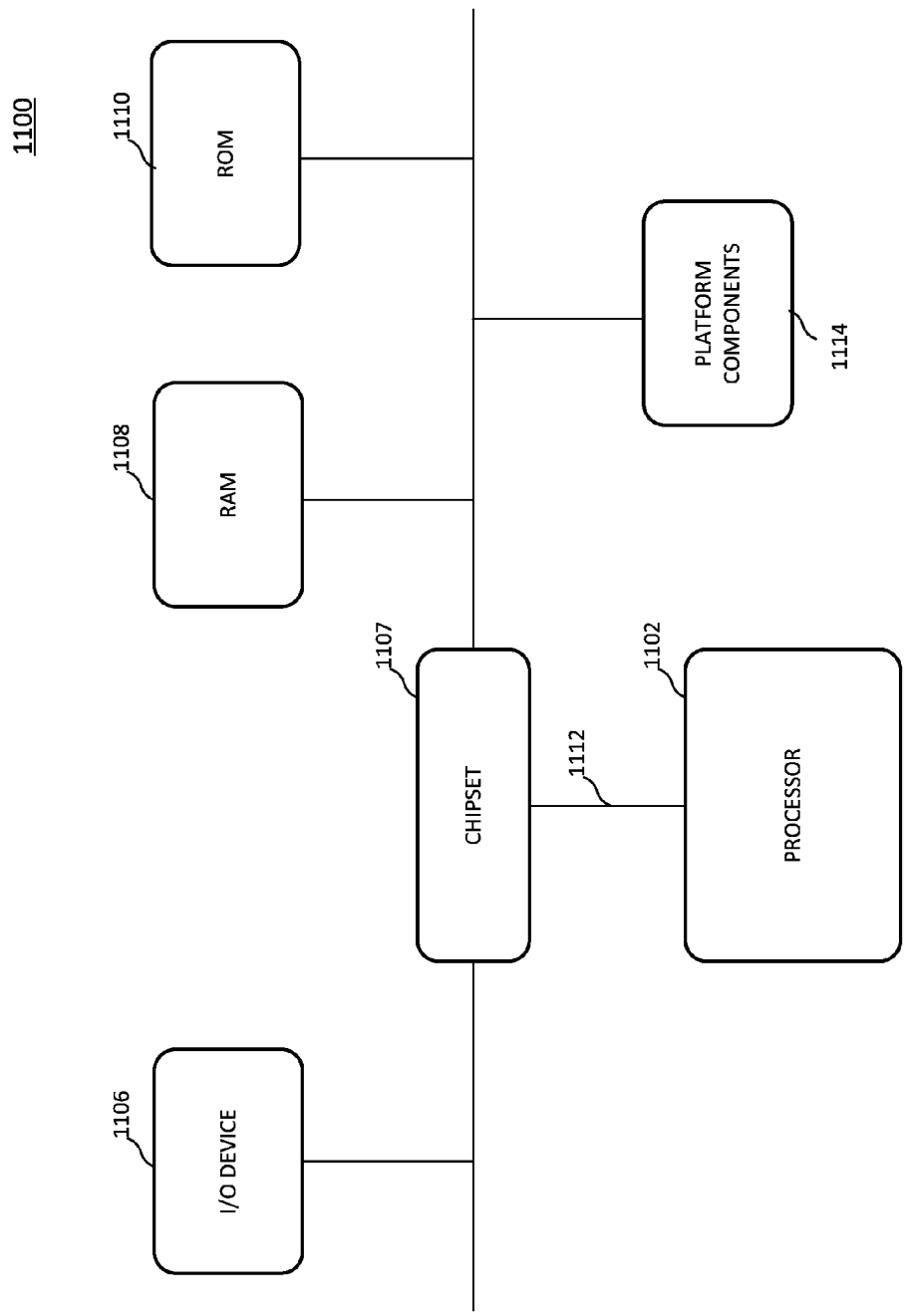
FIG. 11 illustrates an example system.

FIG. 11 is a diagram of an example system 1100 for a computing device. In particular, FIG. 11 is a diagram showing a system 1100, which may include various elements. For instance, FIG. 11 shows that system 1100 may include a processor 1102, a chipset 1104, an input/output (I/O) device 1106, a random access memory (RAM) (such as dynamic RAM (DRAM)) 1108, and a read only memory (ROM) 1110, and various platform components 1114 (e.g., a fan, a cross-flow blower, a heat sink, DTM system, cooling system, housing, vents, and so forth). These elements may be implemented in hardware, software, firmware, or any combination thereof. The embodiments, however, are not limited to these elements.

As shown in FIG. 11, I/O device 1106, RAM 1108, and ROM 1011 are coupled to processor 1102 by way of chipset 1104. Chipset 1104 may be coupled to processor 1102 by a bus 1112. Accordingly, bus 1112 may include multiple lines. In various examples, chipset 1104 may be integrated or packaged with processor 1102. Other examples are described and claimed.

Processor 1102 may be a central processing unit including one or more processor cores and may have any number of processors including any number of processor cores. The processor 1102 may include any type of processing unit, such as, for example, CPU, multi-processing unit, a reduced instruction set computer (RISC), a processor that have a pipeline, a complex instruction set computer (CISC), digital signal processor (DSP), and so forth.

Although not shown, the system 1100 may include various interface circuits, such as an Ethernet interface and/or a Universal Serial Bus (USB) interface, and/or the like. In some exemplary embodiments, the I/O device 1106 may include one or more input devices connected to interface circuits for entering data and commands into the system 1100. For example, the input devices may include a keyboard, mouse, touch screen, track pad, track ball, isopoint, a voice recognition system, and/or the like. Similarly, the I/O device 1106 may include one or more output devices connected to the interface circuits for outputting information to an operator. For example, the output devices may include one or more displays, printers, speakers, and/or other output devices, if desired. For example, one of the output devices may be a display. The display may be a cathode ray tube (CRTs), liquid crystal displays (LCDs), or any other type of display.

The system 1100 may also have a wired or wireless network interface to exchange data with other devices via a connection to a network. The network connection may be any type of network connection, such as an Ethernet connection, digital subscriber line (DSL), telephone line, coaxial cable, etc. The network may be any type of network, such as the Internet, a telephone network, a cable network, a wireless network, a packet-switched network, a circuit-switched network, and/or the like.

Various examples may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one example may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture. An article of manufacture may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof.

According to some examples, an article of manufacture may include a non-transitory storage medium to store or maintain instructions that when executed by a computer or system, cause the computer or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a computer to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
non-volatile memory configured to operate at one or more frequencies;
input/output pins for the non-volatile memory;
command/address pins for the non-volatile memory;
a mode register configured to include default values to indicate default configurations for the one or more operating frequencies, the input/output pins and the command/address pins, the mode register also configured to operate in cooperation with a controller to include updated values based on one or more capabilities of the non-volatile memory discovered by the controller during initialization or power-up of the non-volatile memory, the updated values to indicate updated configurations for one or more operating frequencies, the input/output pins or the command/address pins; and
a configuration table to include information to indicate address lengths associated with separate memory addressing fields of a memory addressing field format associated with a memory address mapping scheme for the non-volatile memory, the indicated address lengths including at least one reserved value for each respective memory addressing field, the configuration table configured to provide the indication of address lengths as discoverable capabilities to the controller during initialization or power-up of the non-volatile memory.

2. The apparatus of claim 1, comprising a clock to provide the one or more operating frequencies.

3. The apparatus of claim 1, comprising the address lengths associated with separate memory addressing fields of a memory addressing field format to indicate address lengths for a partition address, a slice address, wordlines addresses or bitlines addresses.

4. The apparatus of claim 1, comprising a second configuration table to include information to operate the non-volatile memory at various power states, the second configuration table configured to present the various power states as discoverable capabilities to the controller during initialization or power-up of the non-volatile memory.

5. The apparatus of claim 4, comprising the various power states to include an active power state, an idle power state, a fast standby power state, a slow standby power state, a power down power state or an off power state.

6. The apparatus of claim 1, comprising the capabilities discovered by the controller to include available operating frequencies, available input/output pins, available address/command pins and a mode of operation for the non-volatile memory to include a storage mode or a memory mode.

7. The apparatus of claim 6, the updated values included in the mode register to indicate a selected operating frequency from among the available operating frequencies, active input/output pins from among the available input/output pins and active address/command pins from among the available address/command pins, the indication of the selected operating frequency, the active input/output pins and the active address/command pins to be based on the mode of operation discovered by the controller.

8. The apparatus of claim 7, comprising a higher number of active input/out pins and address/command pins for the memory mode of operation as compared to the number of active input/out pins and address/command pins for the storage mode of operation.

9. The apparatus of claim 6, comprising the mode of operation provided to the controller from an application operative on a computing platform using the non-volatile memory.

10. A method comprising:
storing default values to a mode register for a non-volatile memory, the default values to indicate default configurations for an operating frequency, input/output pins and command/address pins for the non-volatile memory at power-up or initialization;
receiving updated values based on one or more capabilities of the non-volatile memory discovered during initialization or power-up of the non-volatile memory;
storing the updated values in the mode register to enable the operating frequency, the input/output pins or the command/address pins to be configured based on the updated values; and
storing information in a configuration table, the information to include an indication of address lengths associated with separate memory addressing fields associated with a memory address mapping scheme for the non-volatile memory, the indicated address lengths including at least one reserved value for each respective memory addressing field, the configuration table configured to provide the indication of address lengths as discoverable capabilities during initialization or power-up of the non-volatile memory.

11. The method of claim 10, comprising the address lengths to indicate address lengths for a partition address, a slice address, wordlines addresses or bitlines addresses.

12. The method of claim 10, comprising storing information in a second configuration table to operate the non-volatile memory at various power states, the second configuration table configured to present the various power states as discoverable capabilities during initialization or power-up of the non-volatile memory.

13. The method of claim 10, comprising the discovered capabilities including available operating frequencies, available input/output pins, available address/command pins and a mode of operation for the non-volatile memory to include a storage mode or a memory mode.

14. The method of claim 13, storing the updated values in the mode register to indicate a selected operating frequency from among the available operating frequencies, active input/output pins from among the available input/output pins and active address/command pins from among the available address/command pins, the indication of the selected operating frequency, the active input/output pins and the active address/command pins to be based on the mode of operation discovered during initialization or power-up of the non-volatile memory.

15. A method comprising:
receiving power state information to configure a non-volatile memory to operate at various power states on a computing platform, the various power states including an active power state, an idle power state, a fast standby power state, a slow standby power state, a power down power state or an off power state, the fast standby power state and the slow standby power state to include the non-volatile memory in a refresh state that includes periodically turning on one or more circuits to refresh internal paths on the non-volatile memory, the fast standby power state to result in the non-volatile memory periodically turning on the one or more circuits at a first rate that is more frequent than a second rate for the slow standby power state, the power state information to include indicators to be used to transition the non-volatile memory between at least some power states;
operating the non-volatile memory at the idle power state;
transitioning the non-volatile memory to operate at the slow standby power state, the transition to the slow standby power state responsive to a power saving indication from a platform power manager for the computing platform; and
transitioning the non-volatile memory to operate at the active power state, the transition to the active power state responsive to a high performance indication from the platform power manager, the active power state to include operating the non-volatile memory at a power state consuming the highest amount of power.

16. The method of claim 15, comprising receiving the power state information from a power state operation table associated the non-volatile memory.

17. The method of claim 15, comprising the indicators to include a chip select indicator and a clock enable indicator to be used to transition the non-volatile memory between at least some of the power states.

18. The method of claim 15, comprising transitioning the non-volatile memory from the slow standby power state to the active power state within 10 microseconds.

19. The method of claim 15, comprising the power saving and the high performance indications being based on Advanced Configuration and Power Interface (ACPI) specification performance states for one or more processor elements operated on the computing platform.

20. An article of manufacture comprising a non-transitory storage medium containing instructions that when executed cause a system to:
receive power state information to configure a non-volatile memory to operate at various power states on a computing platform, the various power states to include an active power state, an idle power state, a fast standby power state, a slow standby power state, a power down power state or an off power state, the fast standby power state and the slow standby power state to include the non-volatile memory in a refresh state that includes periodically turning on one or more circuits to refresh internal paths on the non-volatile memory, the fast standby power state to result in the non-volatile memory periodically turning on the one or more circuits at a first rate that is more frequent than a second rate for the slow standby power state, the power state information to include indicators to be used to transition the non-volatile memory between at least some power states;

operate the non-volatile memory at the idle power state;

transition the non-volatile memory to operate at the slow standby power state, the transition to the slow standby power state responsive to a power saving indication from a platform power manager for the computing platform; and transition the non-volatile memory to operate at the active power state, the transition to the active power state responsive to a high performance indication from the platform power manager, the active power state to include operating the non-volatile memory at a power state consuming the highest amount of power.

21. The article of manufacture of claim 20, comprising the instructions to cause the system to receive the power state information from a power state operation table associated with the non-volatile memory.

22. The article of manufacture of claim 20, comprising the indicators to include a chip select indicator and a clock enable indicator, the instructions to cause the system to use the chip select indicator and the clock enable indicator to transition the non-volatile memory between at least some of the power states.

23. The article of manufacture of claim 20, comprising transitioning the non-volatile memory from the second power state to the third power state within 10 microseconds.

24. An article of manufacture comprising a non-transitory storage medium containing instructions that when executed cause a system to:

store default values to a mode register for a non-volatile memory, the default values to indicate default configurations for an operating frequency, input/output pins and command/address pins, the default configuration to be used at power-up or initialization of the non-volatile memory;

receive updated values based on one or more capabilities of the non-volatile memory discovered during initialization or power-up of the non-volatile memory;

store the updated values in the mode register to enable the operating frequency, the input/output pins or the command/address pins to be configured based on the updated values; and store information in a configuration table, the information to include an indication of address lengths associated with separate memory addressing fields associated with a memory address mapping scheme for the non-volatile memory, the indicated address lengths including at least one reserved value for each respective memory addressing field, the configuration table configured to provide the indication of address lengths as discoverable capabilities to a controller for the non-volatile memory during initialization or power-up of the non-volatile memory.

25. The article of manufacture of claim 24, comprising the instructions to cause the system to store information in a second configuration table to operate the non-volatile memory at various power states, the second configuration table configured to present the various power states as discoverable capabilities a controller for the non-volatile memory during initialization or power-up of the non-volatile memory.

* * * * *